(12) United States Patent
Saether

(10) Patent No.: US 8,587,359 B2
(45) Date of Patent: Nov. 19, 2013

(54) LEVEL SHIFTER WITH OUTPUT LATCH

(75) Inventor: Terje Saether, Trondheim (NO)

(73) Assignee: Atmel Corporation, San Jose, CA (US)

( * ) Notice: Subject to any disclaimer, the term of this patent is extended or adjusted under 35 U.S.C. 154(b) by 557 days.

(21) Appl. No.: 12/537,876

(22) Filed: Aug. 7, 2009

(65) Prior Publication Data

US 2011/0032019 A1   Feb. 10, 2011

(51) Int. Cl.
*H03L 5/00* (2006.01)

(52) U.S. Cl.
USPC .......................................................... 327/333

(58) Field of Classification Search
USPC ........ 327/333, 143, 199, 427; 326/68, 80, 81; 365/189.11
See application file for complete search history.

(56) References Cited

U.S. PATENT DOCUMENTS

| | | | |
|---|---|---|---|
| 6,667,648 B2* | 12/2003 | Stout et al. ..................... | 327/333 |
| 7,005,908 B2* | 2/2006 | Lee et al. ...................... | 327/333 |
| 7,091,748 B2* | 8/2006 | Wada .............................. | 326/81 |
| 7,176,741 B2* | 2/2007 | Ishikawa et al. .............. | 327/333 |
| 2003/0179032 A1* | 9/2003 | Kaneko et al. ................ | 327/333 |
| 2008/0162997 A1* | 7/2008 | Vu et al. ......................... | 714/27 |

* cited by examiner

*Primary Examiner* — Long Nguyen

(74) *Attorney, Agent, or Firm* — Baker Botts LLP

(57) ABSTRACT

A level shifter for a microcontroller shifts an input voltage in a first power domain to an output voltage level consistent with a second power domain. The level shifter is enabled to shift the voltages when both power domains are operative.

19 Claims, 3 Drawing Sheets

LEVEL SHIFTER WITH OUTPUT LATCH

BACKGROUND

Microcontrollers have operated with two different power domains. Usually, a main power domain controls the operation of one or more secondary power domains. The main power domain powers a microcontroller, which then controls the powering up and powering down of the secondary power domains. Level shifters are used to shift input signal voltage levels between the different power domains. In some prior level shifters, a pair of cross coupled transistors forming an inverter are powered by the power domain to which signals are to be converted, and are controlled by the input signal and its complement.

If the microcontroller does not control the secondary power domains, it may not be aware that a secondary power domain has been powered down. This may result in floating input signal voltage levels and therefore an unpredictable output signal from the level shifter. Further, such floating input signal voltage levels may cause unnecessary current drain from the main power domain.

SUMMARY

A level shifter shifts an input voltage in a first power domain to an output voltage level consistent with a second power domain. The level shifter is enabled to shift the voltages when both power domains are operative.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1:
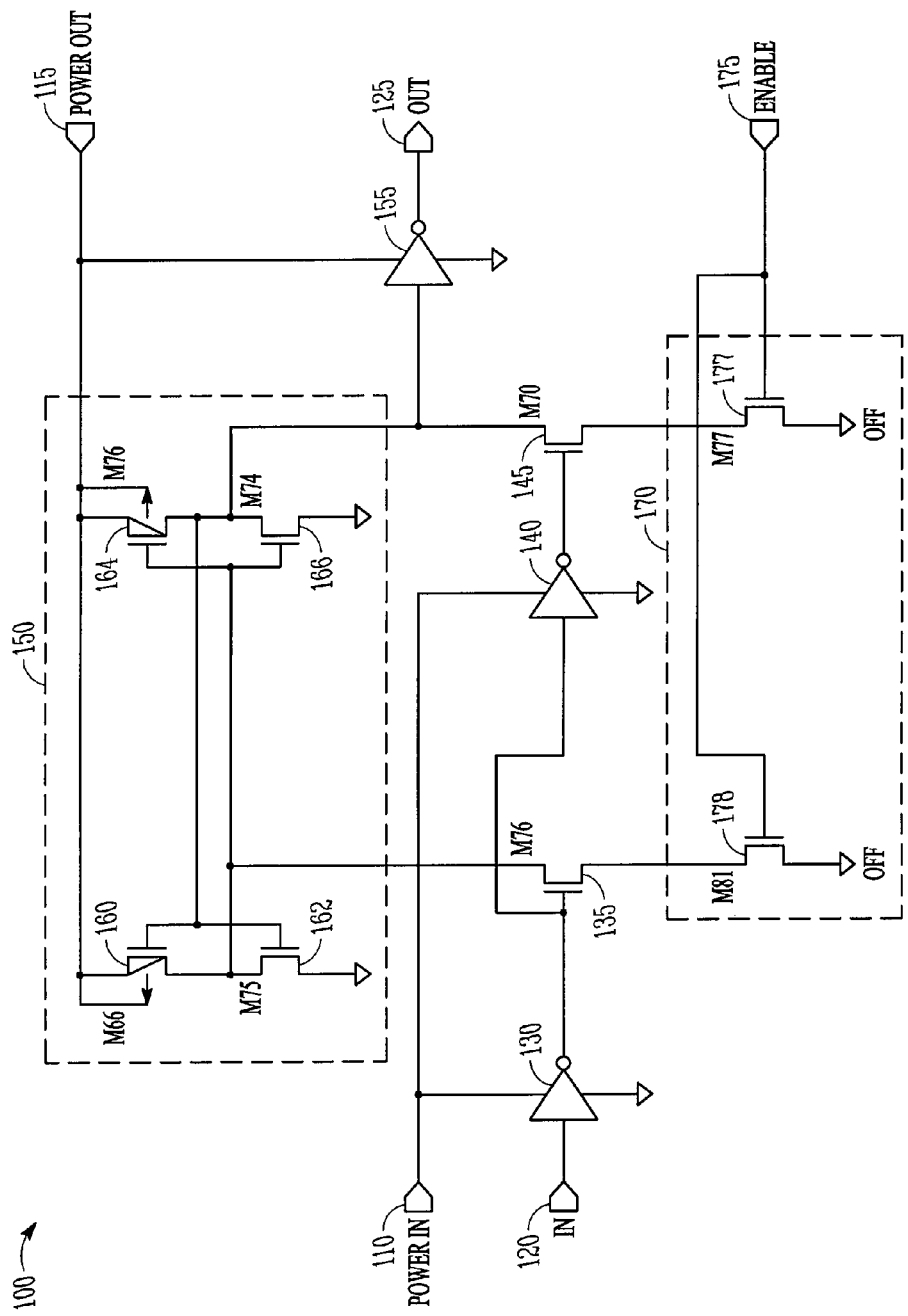
FIG. 1 is a circuit diagram of a level shifter according to an example embodiment.

FIG. 1 is a circuit diagram of a level shifter 100 according to an example embodiment. Level shifter 100 has a power in connector 110 for coupling to a first power domain, and a power out connector 115 for coupling to a second power domain. In one embodiment, one of the power domains is an analog power domain corresponding to capacitive based touchscreen, and the other power domain is a digital domain corresponding to a microcontroller for the touchscreen to interface with the touchscreen, providing control signals and receiving output from the touchscreen. In further embodiments, the domains may correspond to many different types of devices, and multiple power domains may be shifted between by the level shifter 100. Any of the power domains may be coupled to the power in connector 110, with any other power domain coupled to the power out connector 115 to provide for shifting of voltages between any combination of power domains.

An input 120 receives input signals having a voltage level corresponding to the power domain coupled to power in connector 110. The input signals are shifted in voltage to provide on output signal at output 125. The logic levels of the output signal correspond to the power domain coupled to power out connector 115. Input 120 is coupled to an inverter 130, which is further coupled to a first input transistor 135 and through a further inverter 140 to a second input transistor 145. The inverters 130 and 140 are powered by the power domain coupled to power in connector 110. Input transistors 135 and 145 are coupled to a set of cross coupled inverters 150 that are powered by the power domain coupled to power out connector 115. The cross coupled inverters 150 are coupled to an output inverter 155, that provides the level shifted output signal at output 125.

In one embodiment, cross coupled inverters 150 comprise a first pair of transistors 160, 162 having their gates tied together, and a second pair of transistors 164, 166 having their gates tied together. The gates of the first pair of transistors 160, 162 are also coupled between transistors 164, 166, and the gates of the second pair of transistors 164, 166 are coupled between transistors 160, 162. The cross coupled inverters 150 operate to provide a stable logic level voltage to the output inverter 155. In one embodiment, only one of the input transistors 135, 145 are active, as they receive opposite level inputs as a result of inverter 140 inverting the input signal for transistor 145. Since input transistor 135 is coupled to the gates of transistors 164 and 166, and input transistor 145 is coupled to the gates of transistors 160, 162, the cross coupled inverters provide either a high or low logic level.

In one embodiment, a switch 170 is coupled to an enable connector 175 to receive an enable signal. If the power domain coupled to power in connector 110 is powered down, or otherwise not operating, the enable signal is set to zero, turning off two transistors 177, 178 that form the switch 170 in one embodiment. Transistor 178 is coupled to the first input transistor 135. When no current flows through first input transistor 135, the gates of the second pair of transistors 164, 166 remain unchanged and are latched. The gates of the second pair of transistors 164, 166 are forced to zero when current flows through transistors 178 and 135. The gates of transistors 164 and 166 are forced to one when current flows through transistors 177 and 145. In this embodiment, the cross coupled inverters 150 operate as a latch under the control of the enable signal from enable connector 175, holding the current value of the output 125. The switch 170, when the enable signal is low, not only latches the current value of the output 125, it also ensures that no current is drawn from the power domain coupled to the power out connector 115, since transistors 177 and 178 are off.

Figure 2:
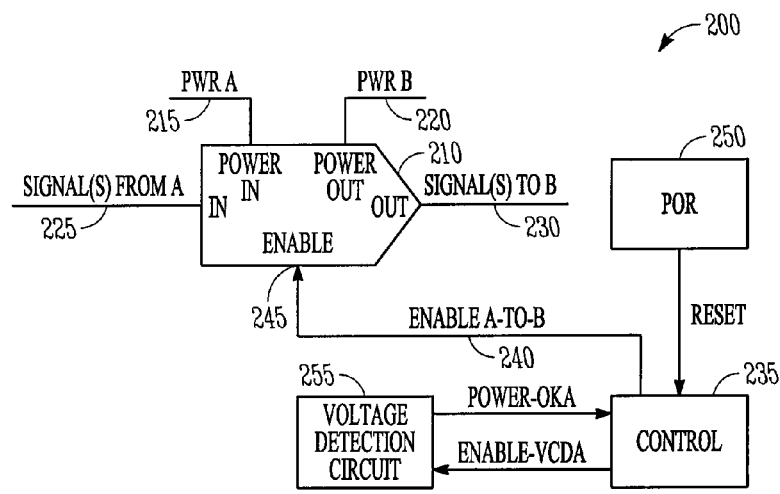
FIG. 2 is a block diagram of a system utilizing a level shifter to shift voltage levels from one domain to another according to an example embodiment.

FIG. 2 is a block diagram of a system 200 utilizing a level shifter 210 to shift voltage levels from one domain to another. In one embodiment, there are two power domains, A and B, indicated at 215 and 220 respectively, and labeled PWRA and PWRB in FIG. 2. When a device in one domain receives a signal from another power domain, one or more level shifters 210 are enabled. In one embodiment, one domain requests the signal from the other domain, and enables the one or more level shifters 210. The use of the level shifters 210 help prevent one domain from sending false signal levels to the other domain. In FIG. 2, the conversion is shown as taking place from domain A to domain B. In further embodiments, the conversion may take place from domain B to domain A, and may be shown simply by changing the letters A and B in FIG. 2.

Level shifter 210 is shown with an input 225 to receive signals from power domain A, and an output 230 to provide output signals consistent with power domain B. A controller 235 is coupled to provide an enable A to B signal on line 240 to an enable input 245 of level shifter 210. The controller 235 is also coupled to a power on reset block 250 to reset power in one or more of the domains, and a voltage detection circuit 255 to determine whether one or more of the domains is powered.

In operation, prior to starting, both domains are without power. Power may than be provided by turning on domain A. Domain A waits for domain B to become active, such as by being turned on. When domain B is turned on, domain A detects that domain B is active via voltage detection circuit 255, and will enable signals from domain B to domain A. Domain B detects that domain A is active and enables signals from domain A. At this point, the level shifter 210 is active and working normally. The domains may now save status information into the other domains.

If domain A is turned off, domain B detects that domain A is turned off and disables the level shifters 210 which shifts from domain A to domain B. This prevents domain A from sending false signals to domain B and also prevents domain A from leaking current from domain B. Before domain A was turned off, it may have saved information in domain B and is now able to read back this information as domain B has not lost its power. This technique enables both domain A and domain B to save information into the other power domain. As long as one domain has power, the information is not lost. In one embodiment, one of the power domains includes a microcontroller, and may be a dominant domain.

Figure 3:
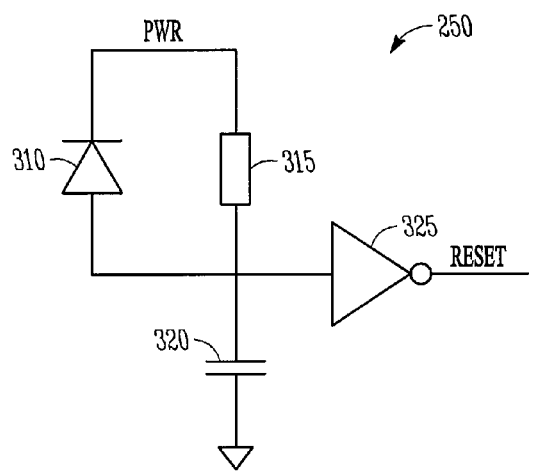
FIG. 3 is a simplified example circuit diagram of a power reset device according to an example embodiment.

FIG. 3 is a simplified example circuit diagram of a power reset device 250 according to an example embodiment. A diode 310 and load 315 are coupled in parallel to a power source 320. A capacitor 325 couples both the diode 310 and load 315 to ground. A diode 330 is coupled to the diode 310, load 315 and capacitor 325 to quickly discharge the capacitor 325 when the power is turned off. When the power is again turned on, the voltage on the capacitor 325 is zero, which gives a reset. The capacitor then charges through the load 315, such as a resistor, which turns off the reset.

Figure 4:
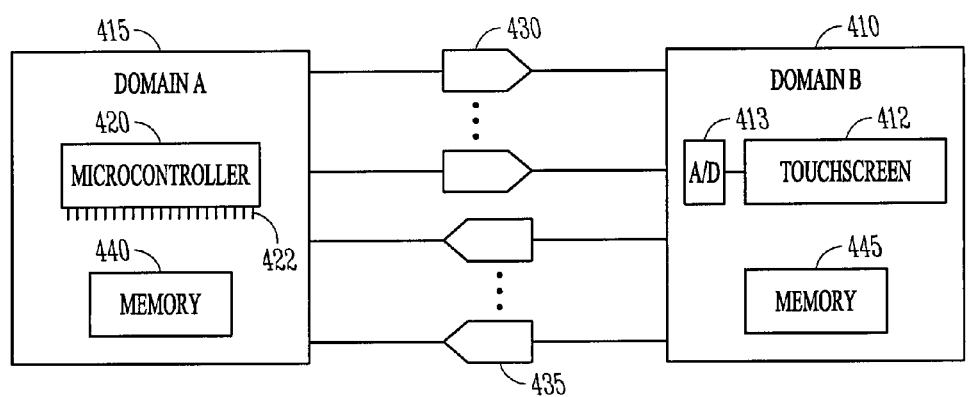
FIG. 4 is a block system diagram illustrating circuitry associated with multiple power domains with level shifters according to an example embodiment.

FIG. 4 is a block system diagram illustrating circuitry associated with multiple power domains with level shifters according to an example embodiment. In one embodiment, a power domain 410, labeled Domain B, is an analog power domain corresponding to capacitive based touchscreen 412, and the other power domain 415, labeled Domain A, is a digital domain having a microcontroller 420 for the touchscreen 412 to interface with the touchscreen 412, providing control signals and receiving output from the touchscreen via an analog to digital converter 413 coupled to touchscreen 412. Microcontroller 420 in one embodiment, has multiple I/O pins as indicated at 422.

Multiple level shifters indicated at 430 and 435 shift voltage levels on signals being transferred between the two domains. In one embodiment, the level shifters 430 shift levels from Domain A 415 to Domain B 410, while level shifters 435 shift levels from Domain B 410 to Domain A 415. There may be hundreds of level shifters to handle the many channels which may be used to drive and sense signals from touchscreen 412, and other input/output pins or connectors corresponding to devices in each domain. In one embodiment, the level shifters may be formed on a chip that includes the microcontroller 420 between the microcontroller circuitry and microcontroller I/O pins 422, or may be formed on a separate chip if desired. In further embodiments, the level shifters may be formed on multiple chips and located proximate circuitry in either power domain.

In one embodiment, a memory 440 in Domain A 415 may be associated with microcontroller 420, or integrated with microcontroller 420 on the same chip. A further memory device 445 may be located in Domain B 410. The memory devices may be any form of memory that can store information in either a volatile or non-volatile manner, including registers and many different forms of random access memory. In further embodiments, the memory may include storage devices such as disk drives or other computer readable media devices.

The level shifters may be used to transfer information between memories 440 and 445 in one embodiment. Once the information has been transferred, if one power domain goes off, the information may be maintained in the memory device of the other power domain. When the off power domain is repowered or otherwise turned on, the information may be transferred back to it's corresponding memory from the other memory. The level shifters operate to ensure that the proper voltage level signals are received at each power domain.

The invention claimed is:

1. A device comprising:
    a power input to couple to a first power voltage of a first power domain;
    a power output to couple to a second power voltage of a second power domain;
    an input to receive a logic signal having a first level consistent with the first power domain;
    an output to provide a level-shifted logic signal output having a second level consistent with the second power domain;
    a voltage detection circuit coupled to the second power domain;
    a latch operable to selectively latch, in response to receiving an enable signal received from the voltage detection circuit, the level-shifted logic signal output such that, in response to a change in the enable signal from a first value to a second value, the level-shifted logic signal output that exists just prior to or at a time the enable signal changes to the second value is held at the output while the enable signal has the second value; and
    the voltage detection circuit operable to:
        determine whether the first power domain is powered; and
        provide the enable signal based at least on the determination, wherein the first and second power domains are independent from each other.

2. The device of claim 1 wherein the latch comprises a cross-coupled inverter.

3. The device of claim 1 and further comprising a latch switch coupled to the latch and operable to receive the enable signal that controls the latch switch to latch the level shifted logic signal and stops the latch from drawing current from the second power voltage.

4. The device of claim 3 wherein the latch switch comprises a pair of transistors having gates that couple to the enable signal.

5. The device of claim 4 wherein the cross-coupled inverter comprises two pairs of transistors, each transistor in each pair having gates tied together and having the pairs of gates coupled between the transistors of the other pair of transistors.

6. The device of claim 5 wherein the transistors of the latch switch have outputs that are respectively coupled to one of gates of the pairs of transistors of the cross-coupled inverter.

7. The device of claim 1 wherein the device is coupled between a microcontroller and an input pin of the microcontroller.

8. The device of claim 7 wherein the microcontroller is a controller for a touchscreen and the input pin is to couple to an analog to digital converter of the touchscreen.

9. The device of claim 1 wherein the first power domain is an analog domain and the second power domain is a digital domain.

10. The device of claim 9 wherein the voltage of the analog domain is higher than the voltage of the digital domain.

11. A controller comprising:
- a processor operating in a digital power domain, the processor to generate control signals and receive input signals from a touchscreen operating in an analog domain via a plurality of I/O pins;
- each input signal I/O pin having at least one level shifter to switch the voltage level of the input signals from the analog domain to the digital domain, each level shifter comprising:
  - a power input to couple to a first power voltage of a first power domain;
  - a power output to couple to a second power voltage of a second power domain independent from the first power domain;
  - an input to receive a logic signal having a first level consistent with the first power domain;
  - an output to provide a level-shifted logic signal output having a second level consistent with the second power domain; and
  - a latch operable to selectively latch, in response to receiving an enable signal received from the voltage detection circuit, the level shifted logic signal output such that, in response to a change in the enable signal from a first value to a second value, the level-shifted logic signal output that exists just prior to or at a time the enable signal changes to the second value is held at the output while the enable signal has the second value.

12. The controller of claim 11 wherein the latch comprises a cross-coupled inverter.

13. The controller of claim 11 and further comprising a latch switch coupled to the latch and operable to receive an enable signal that controls the latch switch to latch the level shifted logic signal and stop the latch from drawing current from the second power voltage.

14. The controller of claim 13 wherein the latch switch comprises a pair of transistors having gates that couple to the enable signal input.

15. The controller of claim 14 wherein the cross-coupled inverter comprises two pairs of transistors, each transistor in each pair having gates tied together and having the pairs of gates coupled between the transistors of the other pair.

16. The controller of claim 11 wherein each output signal I/O pin has at least one level shifter to switch the voltage level of input signals from the digital domain to the analog domain.

17. The controller of claim 11 and further comprising a voltage detection circuit coupled to second power domain to determine whether the first power domain is powered and to provide the enable signal as a function of the determination.

18. A method comprising:
- shifting input voltages from a first power domain to a second power domain via a level shifter having an input corresponding to first voltages in the first power domain and an output having an output corresponding to second voltages in the second power domain;
- detecting that one of the first and second power domains is off via a voltage detection circuit;
- latching, via an enable signal received from the voltage detection circuit, an output of the level shifter such that, in response to a change in the enable signal from a first value to a second value, the output of the level shifter that exists just prior to or at a time the enable signal changes to the second value is held at the output while the enable signal has the second value; and
- disabling the level shifter responsive to detecting that one of the first and second power domains is off.

19. The method of claim 18 and further comprising:
transferring information from the first power domain to the second power domain and saving the information in the second power domain.

* * * * *